(12) United States Patent
Doran et al.

(10) Patent No.: US 6,590,216 B1
(45) Date of Patent: Jul. 8, 2003

(54) SERVO CONTROL FOR HIGH EMITTANCE ELECTRON SOURCE

(75) Inventors: Samuel K. Doran, Wappingers Falls, NY (US); Steven D. Golladay, Hopewell Junction, NY (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/492,076

(22) Filed: Jan. 27, 2000

(51) Int. Cl.[7] .......................... B23K 15/00; G01R 19/00
(52) U.S. Cl. ..................... 250/427; 250/423 F
(58) Field of Search .............. 250/427, 503.1, 250/505.1, 363.01, 307, 308, 423 F; 315/111.81, 111.61, 383

(56) References Cited

U.S. PATENT DOCUMENTS

| | | | | |
|---|---|---|---|---|
| 4,104,526 A | * | 8/1978 | Albert | ........................ 250/403 |
| 4,309,589 A | * | 1/1982 | Hashimoto et al. | .... 219/121.14 |
| 4,847,504 A | * | 7/1989 | Aitken | ..................... 250/492.2 |
| 5,199,054 A | * | 3/1993 | Adams et al. | ................. 378/21 |
| 5,451,794 A | * | 9/1995 | McKeown | ............... 250/492.3 |
| 5,497,006 A | * | 3/1996 | Sferlazzo et al. | ........... 250/427 |
| 5,610,452 A | * | 3/1997 | Shimer et al. | ................. 307/89 |
| 5,786,669 A | * | 7/1998 | Kobori et al. | ........... 315/169.3 |
| 6,236,164 B1 | * | 5/2001 | Beeteson et al. | ........... 315/167 |
| 6,252,344 B1 | * | 6/2001 | Ooae et al. | ................. 313/413 |
| 6,259,210 B1 | * | 7/2001 | Wells | ..................... 315/111.81 |

* cited by examiner

*Primary Examiner*—John R. Lee
*Assistant Examiner*—Anthony Quash
(74) *Attorney, Agent, or Firm*—Whitham, Curtis & Christofferson, P.C.

(57) ABSTRACT

An automatic control servo system having a number of cascaded loops equal in number to the number of voltage sources applied to elements of a high-emittance electron source provides accurate and stable electron emission current control independently of beam energy and accommodates large differences in thermal mass between the elements of the electron source, as may be encountered in high-emittance, indirectly heated cathode electron sources. Individual loops of the system may be critically tuned independently of each other.

20 Claims, 1 Drawing Sheet

SERVO CONTROL FOR HIGH EMITTANCE ELECTRON SOURCE

BACKGROUND OF THE INVENTION

1. Field of the Invention

The present invention generally relates to control of electron sources to achieve high uniformity and stability over time and, more particularly to control of a high-emittance source of a broad electron beam having substantially uniform electron flux over a large beam cross-section and suitable for use in an electron beam projection lithography tool.

2. Description of the Prior Art

At least one lithographic patterning process is invariably required in the manufacture of electronic integrated circuits. In view of the well-recognized benefits in functionality, performance and manufacturing economy which derive from increased levels of integration density, electron beams have been used to perform exposure of a layer of resist on a wafer at current and foreseeable minimum feature size regimes. However, exposure of entire chip patterns cannot be achieved at the present state of the art of electron beam lithography as has been possible with radiant energy exposure at larger minimum feature sizes and many serial exposures must generally be made for each chip.

To achieve economically acceptable levels of throughput using electron beam exposure, electron beam projection lithography has been used to allow exposure of a sub-field of the chip pattern which is formed in a reticle placed in the beam path (or to which the beam may be directed). By doing so, potentially several million pixels or image features can be simultaneously exposed reducing the number of serial exposures necessary for a chip by several orders of magnitude compared to exposure by a so-called probe forming electron beam exposure tool. Nevertheless, the area which can be covered by a sub-field is limited due to the high degree of resolution and freedom from aberrations which must be maintained to support very small feature size regimes and the complexity of the dynamics of the electron beam. For example, the charge carried by individual electrons causes mutual repulsion, referred to as Coulomb interactions, between them and the effects of these forces is proportional not only to the current in the beam but also electron density within discrete regions within a patterned beam.

To obtain the required pattern fidelity within the sub-field, the beam must be highly uniform over its cross-section prior to patterning. Further, for economically acceptable throughput, the beam current must be relatively high even though it is desirable to keep electron density in the beam as low as possible, consistent therewith. Accordingly, electron sources capable of such a function are often referred to as high-emittance, low brightness sources. Electron density is reduced by choosing the largest practical sub-field dimensions and a relatively large beam divergence angle.

The distribution of energies of the electrons in the beam is also relatively critical to calibration of the various electron-optical correctors (e.g. focus coils, stigmators and the like) in the electron beam tool. Relatively high beam energy is generally preferred to reduce the time over which Coulomb interactions can operate to disturb beam geometry.

A suitable electron source having the above properties has been proposed but is not admitted to be prior art in regard to the present invention. This electron source provides a broad, substantially uniform (or exhibiting a desired emission profile) electron beam using an indirectly heated cathode and provides for electron emission from a directly heated filament to impinge upon and cause further emission from the cathode. The surface of the cathode facing the filament may be contoured to adjust the bombardment electron flux incident on respective regions thereof to enhance emission uniformity. Edges of the beam are intercepted and thus truncated to limit the energy distribution of the electrons allowed to populate the beam.

However, while this electron source provides for good uniformity (or other desired emission profile) over a broad beam and acceptable limitation of electron energy spread, as with any electron source, emission efficiency of surfaces will vary with time and usage. Further, the relative electron emission fluxes from respective elements are interrelated in a complex manner (including radiative heating of the filament by the cathode and vice-versa in accordance with radically differing thermal masses). Long term loss of emission efficiency can, to some extent, be corrected by calibration but the useful lifetime of an electron source to provide acceptable image fidelity depends of the amount of correction available while producing acceptable uniformity of emission.

Another complication of regulation of cathode emission current in electron beam tools is the interrelationship of control parameters since electron emissions may occur which do not contribute to beam current. Further, more or less complex dependencies on chosen operating points and/or tool geometries may be presented. For example, even in a simple, two element, directly heated cathode arrangement, the proportion of electrons emitted which contribute to the beam will vary with accelerating voltage. These dependencies rapidly become much more complex when the emission source has increased numbers of elements (e.g. more than two) and operating currents/voltages respectively provided thereto.

Therefore, compensation of a change of performance of one element with a respective set point may affect the performance of another element and may not result in the desired correction to achieve constant emission current. Additionally, the temperature response of a filament is not instantaneous due to its thermal mass and is usually on the order of a significant fraction of a second which may be significant relative to the frequency of exposure at which an electron beam tool is operated. Moreover, the thermal mass of an indirectly heated cathode is many times larger than that of the filament and cathode response time is on the order of several seconds. Accordingly, unpredictable instabilities and hardware criticalities have complicated the problem of beam current regulation.

SUMMARY OF THE INVENTION

It is therefore an object of the present invention to provide a system for controlling a complex high-emittance electron source which stabilizes electron emission and electron energy over extended periods of time and operation.

It is another object of the invention to provide a control system for an electron source which effectively extends the useful lifetime of a high-emittance electron beam source.

It is a further object of the invention to provide a control system for an electron source capable of regulating electron emission and energy variation to negligibly low levels which maintains electron beam tool exposure uniformity.

It is yet another object of the invention to provide a control system for an electron source having only a single set point control.

In order to accomplish these and other objects of the invention, a system and method are provided for controlling voltage applied to a filament of an electron source using two or more nested feedback loops responsive to detected beam current, a set point, and current output of respective voltage source(s) providing acceleration of electrons.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
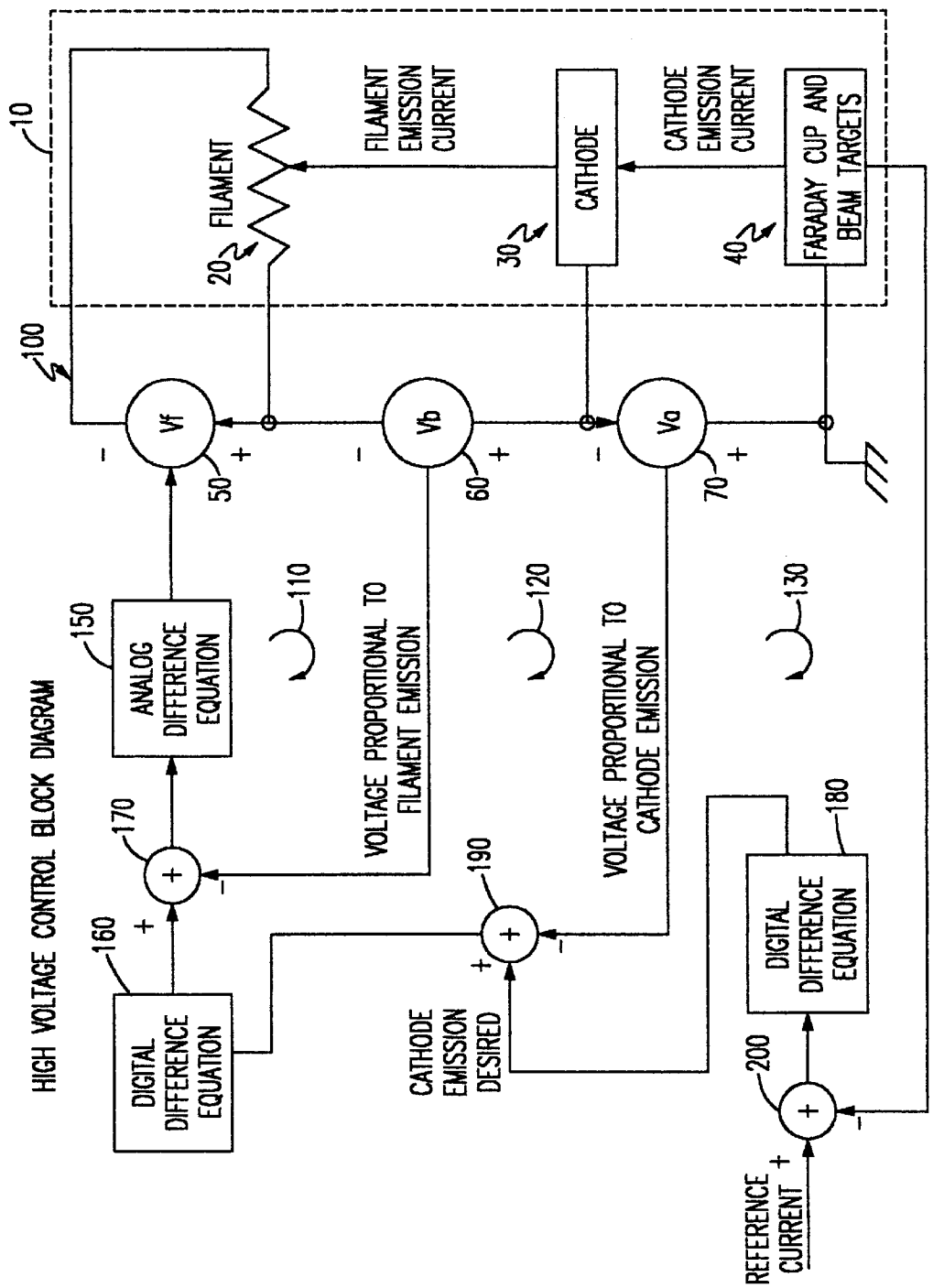
FIG. 1 is a block diagram of a multiple closed loop servo control system in accordance with the invention.

Referring now to the drawings, and more particularly to FIG. 1, there is shown a schematic block diagram of a preferred form of the multiple closed loop control system 100 in accordance with the invention. While closed loop automatic control systems are generally well-known and understood and numerous respective elements illustrated in FIG. 1 will be familiar to those skilled in the art, no portion of FIG. 1 is admitted to be prior art in regard to the present invention.

In FIG. 1, dashed line 10 encloses schematically depicted elements of the electron source of the indirectly heated cathode type. It should be understood that the invention does not require particular details of the implementation of the electron source but can be applied to any electron source having an indirectly heated cathode. Further, the principles of the invention can be readily applied to electron sources having one or more additional elements such as intermediate electrodes, extraction grids and the like. A Faraday cup and beam targets 40, for purposes of this discussion, will be considered as an element of the electron beam lithography exposure apparatus. A Faraday cup is a generic term for beam current sensors that can take occasional samples of the beam current for feedback purposes. However, it is to be understood that such a current sensor is not necessary to development of an electron beam from indirectly heated cathode 30.

The electron source 10 comprises two basic elements, filament 20 and cathode 30, and a current sensor preferably in the form of a Faraday cup 40 which is well-understood in the art as a structure capable of accurately sampling the beam current. The Faraday cup 40 can periodically sample the beam current at selected times such as intervals of stage movement between exposures and is referenced at the same potential as the target (e.g. a resist-coated wafer), depicted in FIG. 1 as ground.

To properly operate the electron source, three voltage sources must be applied to these respective elements. These sources are depicted as being connected in series, as is preferred. For purposes of the invention, all of these voltages sources are voltage programmable. Voltage source Vf, 50, provides a heating current to the filament 20 and produces a filament emission current that is a function of filament temperature and the filament work function, as is well-understood in the art. (The arrow representing filament emission current is oriented to indicate positive current flow in a direction opposite to the direction of negatively charged electrons.) However, during use and/or over time of aging, the impedance of the filament is subject to change due to evaporation of the filament metal. Therefore, the actual emission current must be regarded as a source of variation of emission of the electron source.

As is well understood in the art, the emissions of the cathode are also functionally related to the temperature of the cathode and the work function of the material from which the cathode is formed as well as the energy of the electrons incident thereon which are accelerated from the filament to the cathode by voltage source Vb in the same manner that the energy of the beam at the target is determined by the acceleration voltage source Va applied between the cathode and the target and Faraday cup 40. The heating power applied to the cathode is equal to the product of the net amperes of filament emission current and the bombardment voltage Vb. The temperature of the cathode is the integral of the incoming watt-seconds to the cathode minus the radiated and conducted power from the cathode.

The voltage controlled source Vb 60 and Va 70 can easily provide voltage outputs proportional to the currents passing through respective legs of the circuit using techniques well-understood in the art. The current passing through Vb 60 is equal to the filament emission current. The current passing through Va 70 is equal to the cathode emission current. These voltages proportional to the real-time emission currents can be used by the closed loop servo system for precise control of these critical emission currents.

The emission current from the filament and the cathode are an exponential function of their temperatures and the temperatures are subject to many time-varying drift sources. The exponential nature of the function means that small changes in temperature can cause large changes in emission current. The filament and the cathode must be heated to incandescent temperatures at which there are considerable radiation and conducted heat losses. These heat losses will vary with time as the surrounding components change in temperature. Also, the filament and cathode can transfer heat to and from each other by radiation since they are in close proximity. Further, the filament resistance increases with age and temperature. The servo system must deliver power to the filament and cathode to constantly replenish heat lost through radiation and conduction to maintain the delicate and complex temperature equilibrium that has a natural tendency to drift with time.

It should be appreciated that the control system architecture depicted in FIG. 1 has three closed feedback control loops. This architecture provides several functional advantages since each loop can be individually and critically tuned to optimize performance of the respective loop. This capability is of particular importance in view of the wide range of time constants (e.g. of the filament and cathode, as alluded to above and which can differ by several orders of magnitude in frequency response and phase) which must be accommodated by the control system.

Independence of tuning of the loops thus largely avoids unpredictable instabilities and the utilization of large gain in the control loop without engendering instability of the respective loops. The functional relationship between gain versus frequency and magnitude versus frequency of the three servo control loops is greatly different from one loop to another. For example, in an exemplary embodiment of the invention driving a particular electron source, the filament emission servo has a closed loop bandwidth of 3 Hz and the cathode emission servo has a loop bandwidth of 0.17 Hz. When an inner loop is made stable, insuring stability of more outer loops is easier and less critical, consistent with high accuracy of beam current regulation.

Perhaps more importantly, the connected, nested loops provide for accuracy of measurement of beam current reaching the target and the corresponding emission levels of the respective elements necessary to achieve it. Further, the nested loops in accordance with the invention also provide for the control system to operate with a single set point.

However, the electron beam tool has beam shaping and contrast apertures which intercept large fractions of the beam current in order to achieve uniform current dose over the entire projected pattern. The outermost servo loop 130 guarantees that the portion of beam current which finally reaches the target and is sampled by the Faraday cup is correct and constant in value. Any drifts in amount of Faraday cup current with respect to time can be corrected by changing the set point on the cathode emission servo loop. Therefore, the filament emission current and cathode emission current can be properly regulated without the necessity of accurate measurement of the electron flux incident on the cathode or the electron flux leaving the cathode.

In operation, a current set point (or reference current or voltage representative thereof) is input to a difference amplifier 200 which also receives an output of the Faraday cup on a negative or subtractive input thereof. The difference amplifier thus seeks to minimize the difference between the actual current and the desired reference current input to difference amplifier 200. The output of the difference amplifier 200, reflecting the difference between actual and desired reference currents, is provided to a (preferably digital) difference equation element 180. The difference equation element 180 is evaluated and amplifies the error with a gain that varies with frequency based on classical control theory such that the control loop is stable and accurate.

The output of difference equation element 180 is provided in a similar manner to difference amplifier 190 (as a set point that automatically varies with the beam current error; the forward control being effected by the needed change in cathode emissions to provide desired beam current) while a voltage proportional to the net cathode emission is applied to the negative input thereof from the acceleration voltage source Va. The difference or error in cathode emissions is provided to (preferably digital) difference equation element 160.

The output of difference equation element 160, when the difference equation embodied therein is evaluated, is input in a similar manner to difference amplifier 170 (as a set point that automatically varies with the cathode emission current error; the forward control being effected by the needed change in filament emissions to provide desired beam current) while a voltage proportional to the filament emission is applied to the negative input thereof from bombardment source Vb. The difference or error in filament emissions is provided to (preferably analog) difference equation element 150 which evaluates the difference or error and controls the voltage and power applied to filament 20 to develop the required temperature to obtain correct filament emission current.

In the above described arrangement of the control circuit of FIG. 1 it should be appreciated that the forward control function is always provided by the electron emissions of the respective elements which are automatically adjusted to compensate for changes in respective work functions of the elements. The backward closed loop arrangement provides variable set points that accurately reflect the changes in work function over time and/or usage. The three loops 110, 120 and 130, described above, can thus be described as "cascaded".

It is possible to control Vb instead of the filament emission current to achieve the proper product of filament emission current and Vb to control the cathode temperature. However, it is preferred that the Vb voltage is set to a high fixed voltage so that the servo will naturally minimize the amount of filament emission current required to achieve the proper cathode temperature for the required cathode emission. This will result in a minimum value for the filament power and will optimize the filament life since the filament suffers the same aging process of an ordinary incandescent light bulb. Va voltage is set to a constant value and then regulated with high precision to be certain that the Va voltage remains constant since a change in Va voltage results in an error in every electron optic parameter of the electron beam tool.

The adjustment of set points for control of each element is derived from the current contribution to the beam at each element in the electron source that is subject to independent variation accommodated by the invention. It can be appreciated that the basic principle of the invention can be applied both to directly heated cathodes (using two loops in which the cathode is the filament and the indirectly heated cathode, of course, is omitted) or to indirectly heated cathode arrangements having additional elements or hybrid systems including features of both.

It was noted above, that the difference equations elements 160 and 180 are preferably digital and implemented by recursive processing while difference equation element 150 is preferably an analog element. These preferences are not critical to the practice of the invention in accordance with its basic principles but should be regarded as perfecting features of the invention and may or may not be required in a particular implementation.

In general, in automatic control circuits, often referred to as servo arrangements, the response time or time constant of the controlled structure must be accommodated and maximum control or gain that can be used without engendering instability is desirable. To perform these functions optimally and with minimum operating margins, the control circuit must provide a time constant similar to that of the controlled structure. Further, the response of the time constant of the difference equation must be linear or substantially symmetrical for both positive or negative errors. Long time constants therefore require large values of resistance and capacitance which are often difficult to achieve within hardware and economic constraints. Electrolytic capacitors, for example, can provide large capacitance. values but are polarized and do not have symmetrical properties for positive and negative voltages. Large values of resistance are subject to surface leakage on the resistor body and printed circuit noise and generate thermal noise. On the other hand, analog difference equations are generally simpler and provide enhanced performance when long time constants need not be provided.

As generally alluded to above, the time constants of a filament and a large cathode may differ by several orders of magnitude due to their respective thermal masses. Therefore, the filament time constant can generally be accommodated by an analog circuit while the cathode emission current control will almost invariably require a digital circuit operating by recursive computations. A digital circuit may also provide a means of different loop compensations at different emission current operating points.

In view of the foregoing, it is readily seen that the invention provides an arrangement for stabilizing and maintaining electron emission and beam energy of a high-emittance electron source that effectively increases the useful lifetime of the filament. The accuracy of emission current regulation is sufficient to reduce electron beam current variation to negligibly low levels that do not affect image dose current with respect to time. A single set point simplifies establishment of the desired emission current level. The cascaded closed-loop architecture in accordance with the invention allows each loop to be independently optimized and critically tuned independently of the other loops. The independence of the loops also facilitates fault location if a failure should occur in any loop and automatically compensates for the radiative transfer of heat between the filament and cathode and/or other elements. Further, the independence of the cascaded loops allows application of the principles of the invention to directly heated cathode (e.g. filament) electron sources (in which case the anode electrode or target would correspond to the cathode in the indirectly heated cathode embodiment described above) as well as indirectly heated cathode sources having two or more elements by employing different numbers of cascaded feedback loops.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A system for regulating emission current of an electron source comprising
   a filament for emitting electrons,
   a first voltage source for heating said filament,
   an emission current sensor,
   a second voltage source for supplying an accelerating voltage and a voltage representing current flow at said second voltage source,
   detecting means for detecting a difference between emission current detected by said emission current sensor and a set point,
   means including cascaded feedback loops for controlling said first voltage source responsive to said detecting means and said voltage representing current flow at said second voltage source.

2. A system as recited in claim 1, wherein said means for controlling said first voltage source includes
   means for evaluating an analog difference equation.

3. A system as recited in claim 1, wherein said detecting means includes means for evaluating a digital difference equation.

4. A system as recited in claim 1, further including
   a third voltage source for accelerating electrons emitted by said filament, said third voltage source having means for providing a voltage corresponding to current output of said third voltage source, and
   a cathode element having electrons emitted by said filament incident thereon, and
   further detecting means for detecting a difference between said voltage corresponding to current output of said third voltage source and an output of said detecting means and providing a control signal to said means for controlling said first voltage source.

5. A system as recited in claim 4, wherein said means for controlling said first voltage source includes
   means for evaluating an analog difference equation.

6. A system as recited in claim 4, wherein said detecting means includes
   means for evaluating a digital difference equation.

7. A system as recited in claim 4, wherein said further detecting means includes
   means for evaluating a digital difference equation.

8. A method of controlling current in an accelerated beam in an electron beam tool, said method including steps of
   detecting beam current,
   controlling voltage applied to a filament with two cascaded feedback loops responsive to said beam current detected in accordance with said detecting step, a set point and a current output of an accelerating voltage source.

9. A method as recited in claim 8, including the further step of evaluating an analog difference equation.

10. A method as recited in claim 8, including the further step of
    determining said set point to minimize emission current from said filament.

11. A method as recited in claim 8, including the further steps of
    accelerating electrons between said filament and an indirectly heated cathode with a bombardment voltage,
    wherein said voltage applied to said filament is controlled using three cascaded feedback loops in accordance with said beam current, said set point, said current output of said accelerating voltage source and a current output of a bombardment voltage source.

12. A method as recited in claim 11, including the further step of evaluating an analog difference equation.

13. A method as recited in claim 11, including the further step of evaluating a digital difference equation.

14. A method as recited in claim 13, including the further step of evaluating an analog difference equation.

15. A method as recited in claim 8, including the further step of evaluating a digital difference equation.

16. A method as recited in claim 15, including the further step of evaluating an analog difference equation.

17. A method of controlling current in an accelerated beam in an electron beam tool, said method including steps of
    detecting beam current,
    controlling voltage applied to a filament responsive to said beam current detected in said detecting step, a set point and a current output of an accelerating voltage source, wherein said set point is a desired value for said detected beam current and said voltage is controlled by cascaded feedback loops.

18. A method as recited in claim 17, wherein said detecting step includes
    sampling said beam current.

19. A method as recited in claim 18, wherein said sampling is performed during non-exposure intervals.

20. A method of fabricating a semiconductor device using an electron beam tool comprising
    a filament for emitting electrons,
    a first voltage source for heating said filament,
    an emission current sensor,
    a second voltage source for supplying an accelerating voltage and a voltage representing current flow at said second voltage source,
    detecting means for detecting a difference between emission current detected by said emission current sensor and a set point,
    means including cascaded feedback loops for controlling said first voltage source responsive to said detecting means and said voltage representing current flow at said second voltage source, said method including steps of accelerating electrons between said filament and an indirectly heated cathode with a bombardment voltage, wherein said voltage applied to said filament is controlled using cascaded feedback loops in accordance with said beam current, said set point, said current output of said accelerating voltage source and a current output of a bombardment voltage source, exposing a resist with said electrons to define an element of said semiconductor device, and completing said semiconductor device.

* * * * *